United States Patent
Baker, Jr. et al.

(10) Patent No.: US 10,825,512 B1
(45) Date of Patent: Nov. 3, 2020

(54) MEMORY READS OF WEIGHT VALUES

(71) Applicant: NXP USA, INC., Austin, TX (US)

(72) Inventors: Frank Kelsey Baker, Jr., Austin, TX (US); Thomas Jew, Austin, TX (US); Ronald J. Syzdek, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 16/551,884

(22) Filed: Aug. 27, 2019

(51) Int. Cl.
| | | |
|---|---|---|
| *G11C 5/06* | (2006.01) | |
| *G11C 16/08* | (2006.01) | |
| *G11C 11/419* | (2006.01) | |
| *G11C 11/408* | (2006.01) | |
| *G06F 12/06* | (2006.01) | |
| *G06F 17/16* | (2006.01) | |

(52) U.S. Cl.
CPC ........ *G11C 11/419* (2013.01); *G06F 12/0607* (2013.01); *G06F 17/16* (2013.01); *G11C 11/4085* (2013.01); *G11C 11/4087* (2013.01)

(58) Field of Classification Search
CPC ... G11C 13/0069; G11C 13/004; G11C 16/08; G11C 16/28; G11C 2213/79; G11C 11/1673; G11C 8/08; G11C 11/1659; G11C 16/04; G11C 5/06; G11C 7/14
See application file for complete search history.

(56) References Cited

U.S. PATENT DOCUMENTS

| | | |
|---|---|---|
| 3,524,977 A | 8/1970 | Wang |
| 4,130,877 A | 12/1978 | Riekers |
| 5,912,832 A | 6/1999 | Flahie et al. |
| 8,954,363 B2 * | 2/2015 | Heliot ................. H03M 1/1042 706/36 |
| 9,412,940 B2 * | 8/2016 | Sacchetto ............... G11C 11/56 |
| 9,778,908 B2 | 10/2017 | Elmer |
| 2012/0084241 A1 * | 4/2012 | Friedman ............. G06N 3/0635 706/27 |
| 2012/0317063 A1 * | 12/2012 | Sim .................... G11C 13/0002 706/27 |
| 2013/0103626 A1 * | 4/2013 | Hunzinger ............. G06N 3/049 706/16 |
| 2014/0253215 A1 | 9/2014 | Goyal et al. |
| 2016/0284400 A1 * | 9/2016 | Yakopcic ............. G06N 3/0635 |
| 2016/0336064 A1 * | 11/2016 | Seo ......................... G06N 3/088 |
| 2017/0270403 A1 | 9/2017 | Zhang |

FOREIGN PATENT DOCUMENTS

CN        108038542 A        5/2018

OTHER PUBLICATIONS

Chen, P., "Partition SRAM and RRAM based Synaptic Arrays for Neuro-inspired Computing", IEEE 2016.

* cited by examiner

*Primary Examiner* — Hien N Nguyen
(74) *Attorney, Agent, or Firm* — David G. Dolezal; Joanna G. Geld

(57) ABSTRACT

A memory includes a row decoder that receives an address of a row to be read and an operand. The memory includes a memory array of bitcells that can be configured to store N-bit weight values in which N is an integer greater than one. The row decoder is configured to, for a multiplication mode read operation at the selected word line, selectively activate the selected word line based on a bit value of the received operand to selectively read an N-bit weight value based on a bit value of the operand. Such an operation may in some embodiments, perform a multiplication operation of the bit value of the operand and the N-bit weight value.

20 Claims, 7 Drawing Sheets

DATA IN ARRAY

|  | | COLUMN 0 | COLUMN 1 | COLUMN 2 | COLUMN 3 | COLUMN 4 | COLUMN 5 | COLUMN 6 |
|---|---|---|---|---|---|---|---|---|
| B0 ON CYCLE 1 | ROW 0 | 0 | 0 | 0 | A3 | A2 | A1 | A0 |
| B1 ON CYCLE 2 | ROW 1 | 0 | 0 | A3 | A2 | A1 | A0 | 0 |
| B2 ON CYCLE 3 | ROW 2 | 0 | A3 | A2 | A1 | A0 | 0 | 0 |
| B3 ON CYCLE 4 | ROW 3 | A3 | A2 | A1 | A0 | 0 | 0 | 0 |

407 403 409 411 413

| READ CYCLE | COLUMN 0 OUTPUT | COLUMN 1 OUTPUT | COLUMN 2 OUTPUT | COLUMN 3 OUTPUT | COLUMN 4 OUTPUT | COLUMN 5 OUTPUT | COLUMN 6 OUTPUT |
|---|---|---|---|---|---|---|---|
| CYCLE 1 OUTPUT FROM READ OF ROW 0 | 0 | 0 | 0 | X2-1 | X1-1 | X0-1 | P0 |
| CYCLE 2 OUTPUT FROM READ OF ROW 1 | 0 | 0 | Y3-1 | Y2-1 | Y1-1 | Y0-1 | 0 |
| CYCLE 3 OUTPUT FROM READ OF ROW 2 | 0 | Y3-2 | Y2-2 | Y1-2 | Y0-2 | 0 | 0 |
| CYCLE 4 OUTPUT FROM READ OF ROW 3 | Y3-3 | Y2-3 | Y1-3 | Y0-3 | 0 | 0 | 0 |

MEMORY READS OF WEIGHT VALUES

BACKGROUND OF THE INVENTION

Field of the Invention

This invention relates in general to memories for electronic systems.

Description of the Related Art

Memories are utilized in electronic systems for storing data such as weight values. A weight value can be a value that a data value is multiplied by or otherwise modified by to adjust the data value based on its importance to a system.

BRIEF DESCRIPTION OF THE DRAWINGS

The present invention may be better understood, and its numerous objects, features, and advantages made apparent to those skilled in the art by referencing the accompanying drawings.

FIG. 4 is a table showing weight values stored in an array and a table showing values generated from read operations according to another embodiment of the present invention.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

In some embodiments, a memory includes a row decoder that receives an address of a row to be read and an operand. The memory includes a memory array of bitcells that can be configured to store N-bit weight values in which N is an integer greater than one. The row decoder is configured to, for a multiplication mode read operation at the selected word line, selectively activate the selected word line based on a bit value of the received operand to selectively read an N-bit weight value based on a bit value of the operand. Such an operation may in some embodiments, perform a portion of a multiplication operation of the bit value of the operand and the N-bit weight value.

Figure 1:
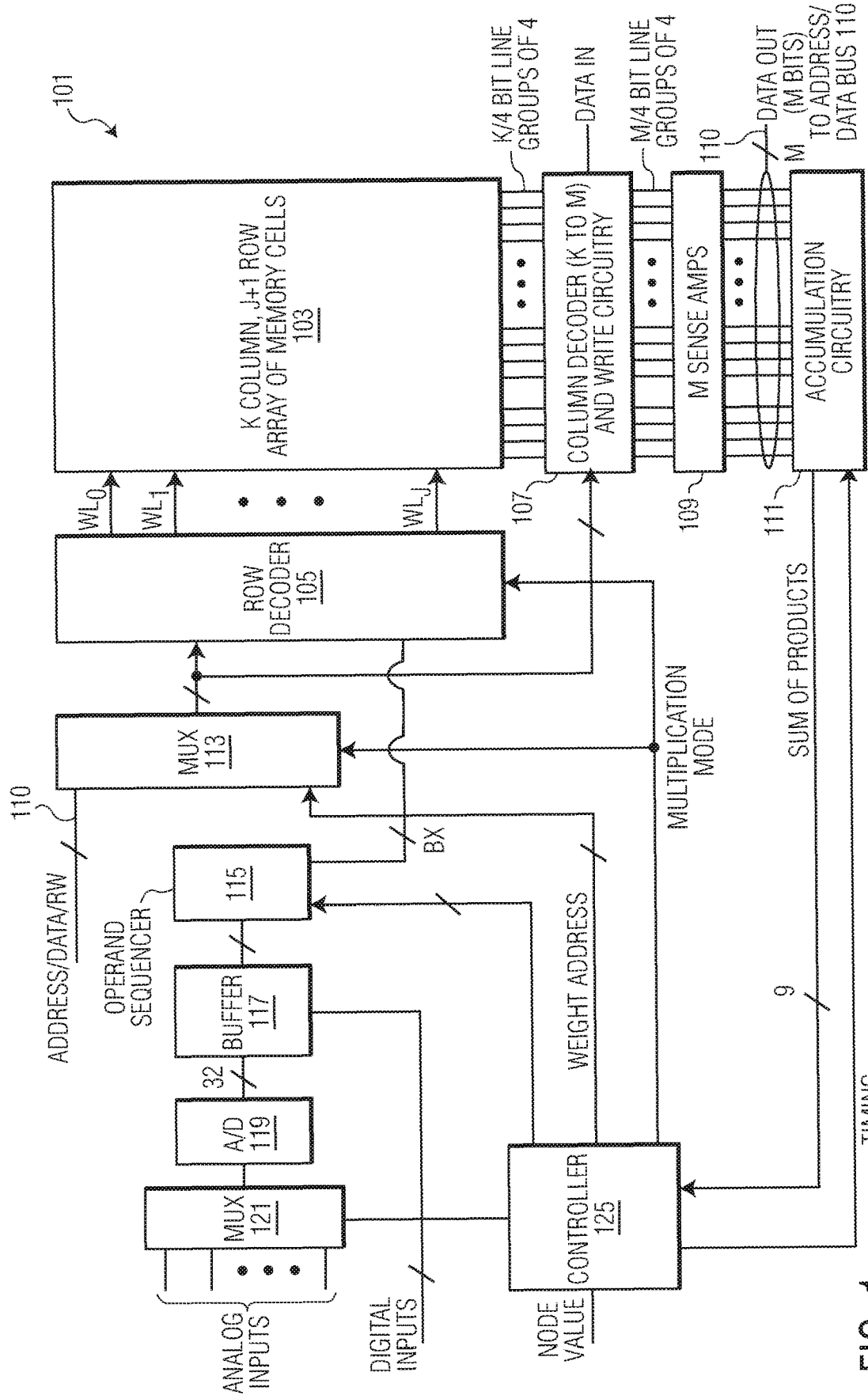
FIG. 1 is a circuit diagram of a memory and input circuitry according to one embodiment of the present invention.

FIG. 1 is a circuit diagram of a memory device and input circuitry according to one embodiment of the present invention. Memory 101 includes an array 103 of memory bitcells arranged in J+1 rows and K columns. Each bitcell of array 103 stores a bit of binary data. In one embodiment, the cells are nonvolatile bitcells such as MRAM, flash, or ReRAM cells, but may be volatile bitcells such as SRAM or DRAM cells in other embodiments. Memory 101 includes a row decoder 105 that receives a portion of an address of a memory location to be accessed from multiplexer 113 and asserts a word line ($WL_X$) corresponding to the received address from a number of word lines ($WL_0$-$WL_J$) for accessing the bitcells coupled to the corresponding word line. In one embodiment, an entire row of array 103 is coupled to a word line. In other embodiments, segments of a row may be coupled to different word lines. In the embodiment shown, memory 101 includes address, data, and control signals (ADDRESS/DATA/RW) that are coupled to a bus 110 for receiving address, data, and control information and for providing read data to requesting devices such as a processor or DMA.

In the embodiment shown, memory 101 includes a column decoder 107 that receives a portion of the address from multiplexer 113. Column decoder 107 selects a portion of the columns of the bit cells coupled to a selected row to provide to the sense amplifiers 109 to read the bit cells of the selected row and selected columns. Column decoder 107 is coupled to K number of columns and provides M number of outputs wherein M is less than K. In one embodiment K/M=8, but may be of other decode ratios in other embodiments. In one embodiment, J+1 is equal to 1024, K is equal to 1024, and M is equal to 128, but these may be other values in other embodiments. In some embodiments, memory 101 does not include a column decoder. In the embodiment shown, column decoder 107 also includes write circuitry for writing data received from the DATA IN lines to the bit cells.

Memory 101 includes M number of sense amplifiers 109 with each sense amplifier including an input coupled to an output of column decoder 107. Sense amplifiers 109 include an output for providing the read values to bus 110 (via the DATA OUT lines) and to accumulation circuitry 111. Memory 101 also includes a controller 125 for controlling the operations of the memory.

Memory 101 includes a multiplication mode of operation that enables data reads to be made where the read data is a multiplication result (product) of weight values stored in array 103 times input data bits (operands). Memory 101 includes a buffer 117 that receives input data from multiplexer 121 via an A/D converter 119. In one embodiment, the analog inputs are each coupled to an off-chip sensor via an I/O circuit of the integrated circuit or an on-chip sensor (neither shown). Examples of sensed data include speed sensor data, radar data, temperature data, vision data, position data etc. The analog inputs are selectively provided to A/D converter 119 by a multiplexer 121 that selects one of the analog inputs for A/D conversion at a time. In the embodiment shown, controller 125 controls which inputs are provided to A/D converter 119.

Buffer 117 can also receive digital inputs from other sources such as calculated data from a processor, data from a DMA, or from another digital systems via an external bus. In some embodiments, controller 125 can write data to buffer 117.

The data in buffer 117 is provided to operand sequencer 115. Operand sequencer 115 takes the digital data in buffer 117 and selectively provides a data bit to row decoder 105 that is used to selectively assert an addressed word line during a multiplication mode memory read of a weight value stored in array 103. In the embodiment shown, during a multiplication mode, at least a portion of the read address is provided from controller 125. The read address includes the address of the weight values to be multiplied. Operand sequencer 115 provides the operand bit value (BX) that is to be multiplied by the weight value in array 103 during a multiplication mode memory read. When placed in a multiplication mode by the MULTIPLICATION MODE signal from controller 125, row decoder 105 selectively asserts the word line corresponding to the address based on whether the operand bit BX is a 1 (word line asserted) or 0 (word line not asserted).

During a multiplication mode data read, the output of a sense amplifier is the multiplication result of the value of the operand bit times a weight bit value of the memory cell being read by the sense amplifier. If the word line is asserted (indicative that the value of the operand bit is "1") and the weight bit value ($W_x$) stored in the memory cell is a "1", then a sense amplifier coupled to the cell will read a 1 (1*1). If word line is asserted (indicative that the value of the operand bit is "1") and the weight bit value ($W_x$) is a "0", then the sense amplifier coupled to the cell will read a "0" (1*0). If the addressed word line is not asserted (indicative that the value of the operand bit is "0") and the weight value ($W_x$) is a "1", then the sense amplifier coupled to the cell will read a "0" (0*1). If the addressed word line is not asserted (indicative that the value of the operand bit is "0") and the weight bit value ($W_x$) is a "0", then the sense amplifier coupled to the cell will read a "0" (0*0). Accordingly, a read operation in multiplication mode performs 1 bit by N bit multiplication operation, where N is the number of weight bits of the weight stored in the addressed cells.

In the embodiment shown, memory 101 includes accumulation circuitry that can take the results of successive multiplication mode data reads and add them together to get a result of a multiplication of a multibit operand ($B_{1-x}$) and a multibit weight value ($W_{1-N}$). In one embodiment, successive multiplication bit reads can be used to multiply the weight value stored in array 103 by a different bit value of the operand ($B_{1-x}$). The resultant multi-bit product is provided to controller 125 (SUM OF PRODUCTS), where it can be provided (as a node value) to a system bus. In other embodiments, the results of the data reads in multiplication mode are provided back to a system processor (not shown) on bus 110 where the system processor adds the read data to obtain the resultant product. An activation function can also be applied to the resultant multi-bit product, in hardware or software, to provide an input for a subsequent layer in a neural network.

Memory 101 also can perform normal mode read operations where data can be read from an address received from bus 110. In a normal mode read, the word line associated with the received address is always asserted to read the values in the cells which are provided back to bus 110. In some embodiments, memory 101 can be configured to allow any row of array 103 to be read in either a multiplication mode or in a normal mode. However, in other embodiments, some of the rows may only be read in multiplication mode and/or some of the rows may only be read in normal mode.

Figure 2:
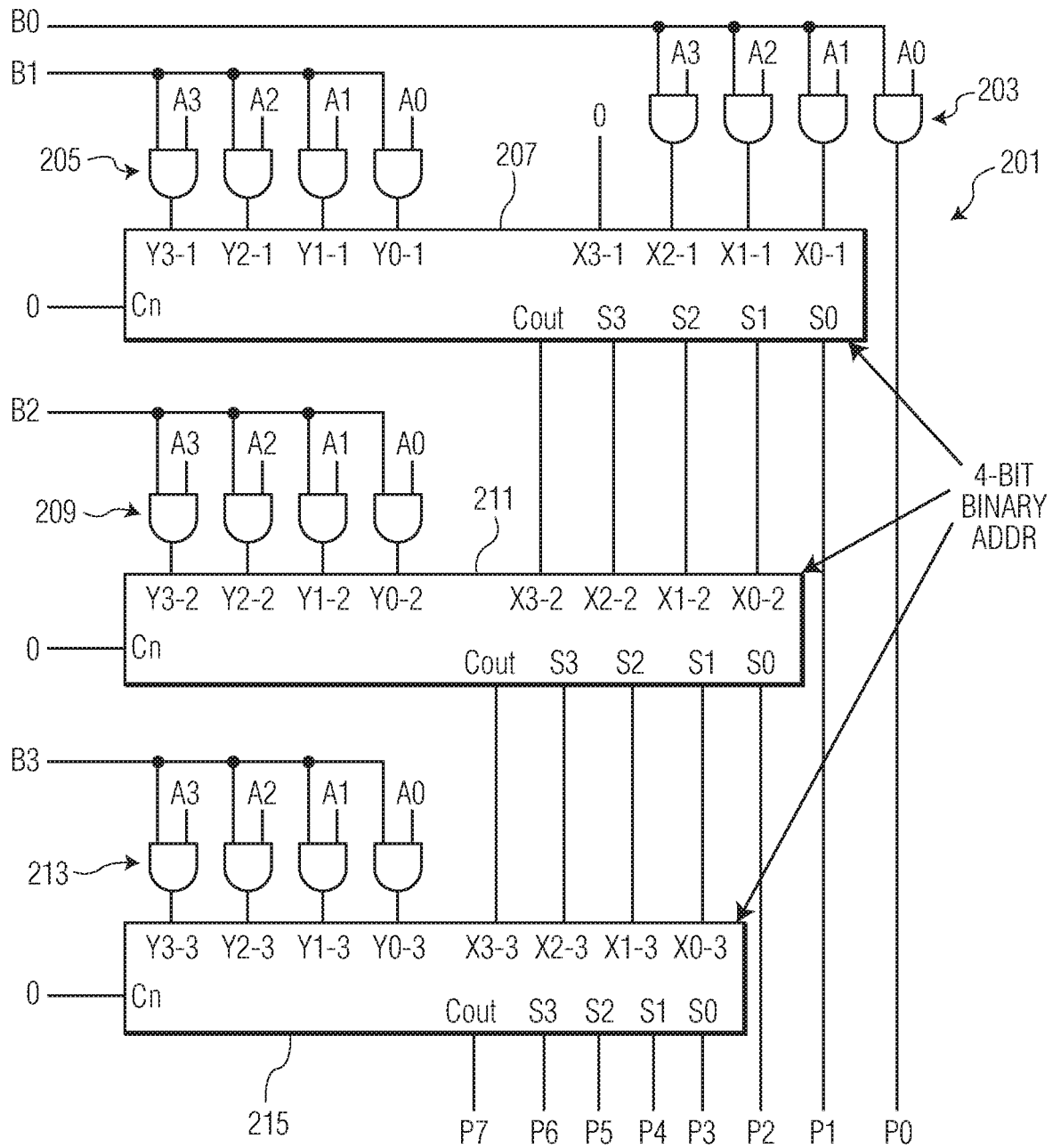
FIG. 2 is a circuit diagram of a prior art 4×4 bit multiplier.

FIG. 2 is a circuit diagram of a prior art multiplier 201 that is used for multiplying two four-bit values (A0-3 and B0-3) to generate a product value (P0-7). In the embodiment shown, multiplier includes four sets of AND gate sets 203, 205, 209, and 213 and three adders 207, 211, and 215. Set 203 multiplies bits A0-3 by B0. The results of the operation are provided as P0 and inputs X0-1, X1-1, and X2-1 of adder 207. The X3-1 input of adder 207 is tied to a "0" value. Set 205 multiples A0-3 by B1 with the results of the operation being provided as inputs Y0-1, Y1-1, Y2-1, and Y3-1 of adder 207. Adder 207 adds the shifted results of the multiplication by set 205 with the results of the multiplication by set 203 and provides outputs COUT, S3, S2, S1, and S0 which are inputs X3-2, X2-2, X1-2, X0-2 (of adder 211), and P1 respectively. Set 209 multiples A0-3 by B2 with the results of the operation being provided as inputs Y0-2, Y1-2, Y2-2, and Y3-2 of adder 211. Adder 211 adds the shifted results of the multiplication by set 209 with the output of adder 207 and provides outputs COUT, S3, S2, S1, and S0 which are inputs X3-3, X2-3, X1-3, X0-3 (of adder 215), and P2 respectively. Set 213 multiples A0-3 by B3 with the results of the operation being provided as inputs Y0-3, Y1-3, Y2-3, and Y3-3 of adder 215. Adder 215 adds the shifted results of the multiplication by set 213 with the output of adder 211 and provides outputs COUT, S3, S2, S1, and S0 which are P7, P6, P5, P4, and P3, respectively. The carry in (CN) of each adder (207, 211, and 215) is tied to a "0" value. P7-P0 represents the binary product of the two 4-bit inputs.

Memory 101 of FIG. 1 can perform the operations of prior art multiplier 201 to achieve a resultant product of a 4×4 bit multiplication of A0-3 by B0-3. In some embodiments, the multiplication operations of AND gate sets 203, 205, 209, and 213 are performed by multiplication mode data reads of memory array 103.

Figure 3:
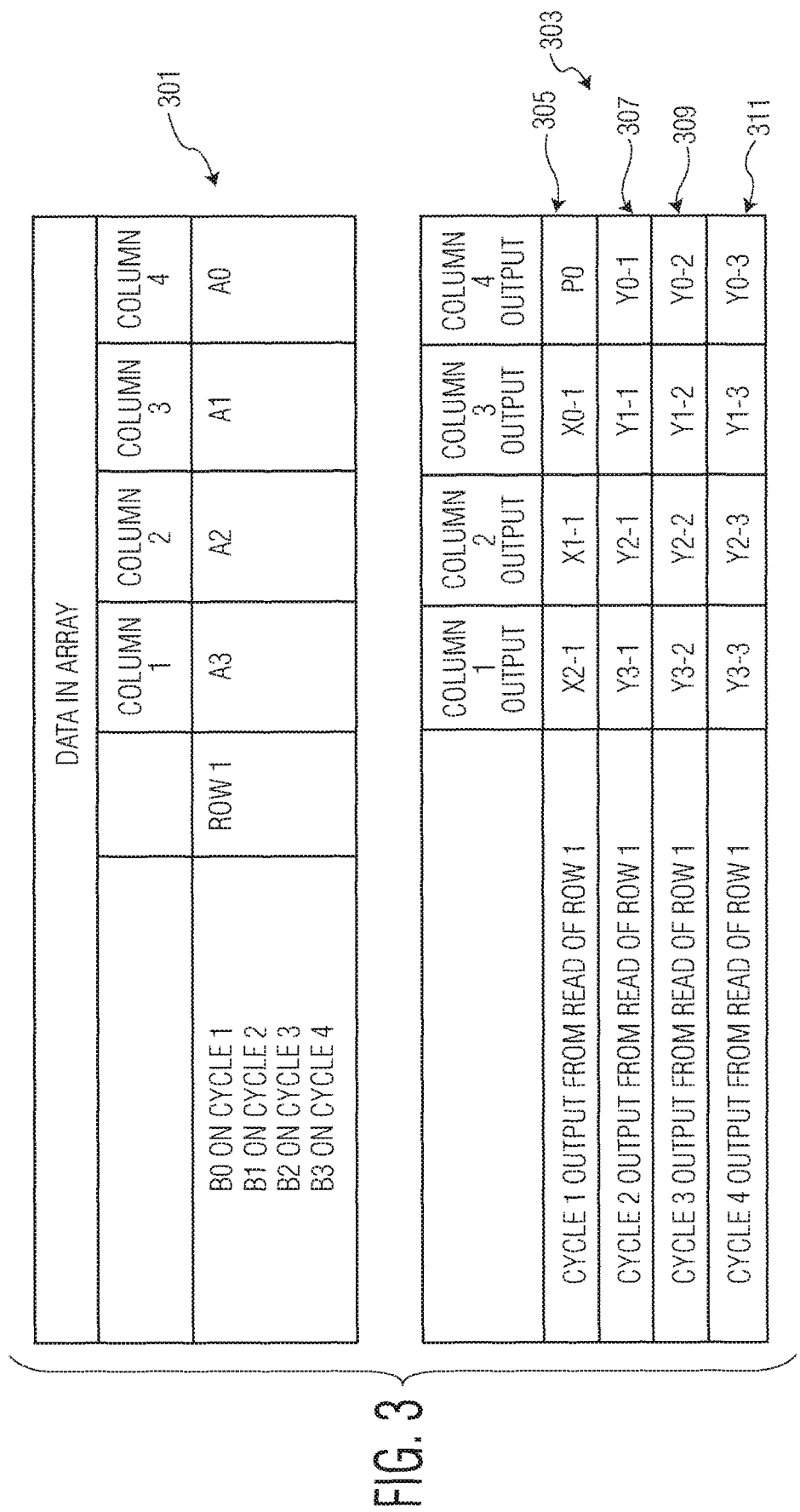
FIG. 3 is a table showing weight values stored in an array and a table showing values generated from read operations according to one embodiment of the present invention.

FIG. 3 sets forth two tables showing a weight value stored in array 103 and data from multiplication mode data reads according to one embodiment of memory 101 in performing the operations of prior art multiplier 201. In the embodiment shown, B0-3 are the 4 bits of input data from operand sequencer 115 that were received either from the analog inputs provided to multiplexer 121 or were received as digital inputs. A0-3 is the 4-bit weight value stored in memory array 103. Table 301 shows that the bits of A0-3 are stored in row 1, columns 4, 3, 2, 1, respectively of array 103. However, they may be stored in other locations of array 103 in other embodiments.

Table 303 shows the results of each multiplication mode data read cycle that performs the functions of AND gate sets 203, 205, 209, and 213, respectively. The results in table 303 are represented by the corresponding signals of multiplier 201 in FIG. 2. In cycle 1, a multiplication mode data read is performed to multiply B0 by A0-3 wherein the results are shown in row 305 of table 303 as X2-1, X1-1, X0-1, (corresponding to the inputs of adder 207 of FIG. 2) and P0 (corresponding to the product P0 bit of adder 207). With a multiplication mode data read, if B0 is a "0", the values of the result of the read will be 0, 0, 0, 0. If B0 is a "1", then the values of the result will be the values of the bits of A0-3.

In cycle 2, B1 is multiplied by A0-3 where the results are shown in row 307 of table 303 which correspond to the signals of multiplier 201. Data read cycle 2 performs the functions of AND gate set 205 of multiplier 201. In cycle 3, B2 is multiplied by A0-3 where the results shown in row 309 of table 303 which correspond to the signals of multiplier 201. Data read cycle 3 performs the functions of AND gate set 209 of multiplier 201. In cycle 4, B3 is multiplied by A0-3 where the results are shown in row 311 of table 303 which correspond to the signals of multiplier 201. Data read cycle 4 performs the functions of AND gate set 213.

Figure 5:
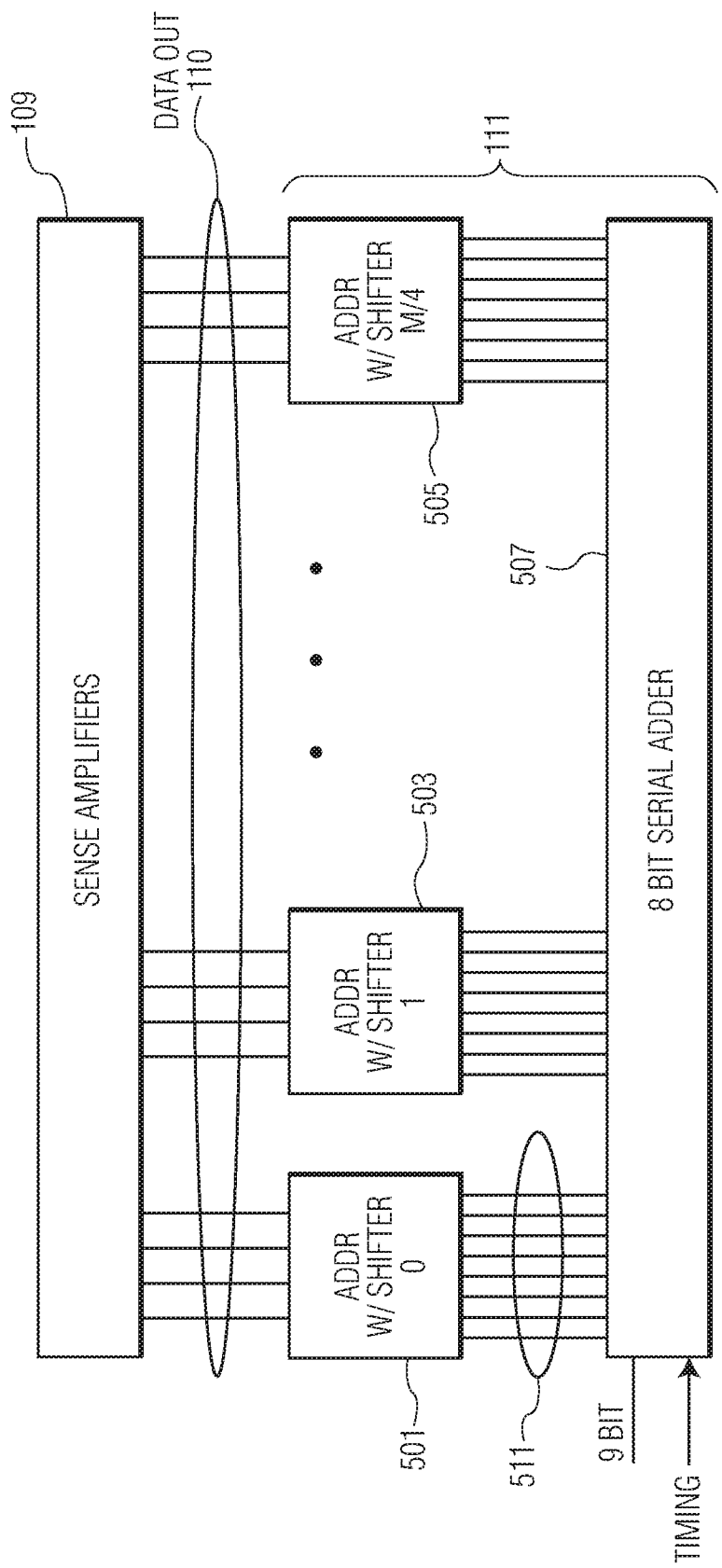
FIG. 5 is a block diagram of accumulation circuitry according to one embodiment of the present invention.

FIG. 5 sets forth a block diagram of adder accumulation circuitry 111 of FIG. 1 for the embodiment of FIG. 3. In the embodiment shown, accumulation circuitry 111 includes multiple adder blocks with shifters (501, 503, and 505). In the embodiment shown, each block (e.g. 501) includes 4 inputs coupled to 4 sense amplifiers of sense amplifiers 109. Each block performs the functions of adders 207, 211, and 215 of prior art multiplier 201 of FIG. 2 for multiplication mode data reads. In one embodiment for performing a 4×4 bit multiplication operation, each block receives the 4-bit resultant values of four 1×4-bit data multiplication reads (see cycles 1-4 of table 303 of FIG. 3).

Prior to multiplication mode read cycle 1, the output of the adder block (e.g. 501) is set to 0. The values of cycle 1 are then inputted into the adder block as the result. Each time on cycles 2, 3, and 4, the prior result is shifted to the right by one-bit position and the values of the cycle are added to the shifted previous result to obtain a new result. After cycle 4, the output of each block is an 8-bit value (corresponding to P0-P7 of FIG. 2) that is provided on 8 output signal lines of the block. As shown in FIG. 5, block 501 includes output signal lines 511.

In the embodiment of FIG. 5, accumulation circuitry 111 includes an 8-bit serial adder 507 that is used to further process the outputs of the adder blocks (501, 503, and 505). In one embodiment, serial adder 507 would be used to add 8-bit products of multiple 4×4 bit multiplications from the blocks. In one embodiment, the 8-bit products are added to generate a node value for a neural net. In one example of such an embodiment, each input value is a value from a previous layer of the neural net. A node of a subsequent layer is calculated by multiplying the nodes from the previous layers by the weight values and adding up the products. In one embodiment, adder 507 is able to add the results of different 4×4-bit multiplications from different blocks 501, 503, and 505 that occur at different times. In some embodiments, an operand bit is multiplied by multiple multi-bit weight values stored in a row during a multiplication mode data read where each block 501 produces a product of the multiplication of the operand and one of the multi-bit weight values. The products can be added together by adder 507.

FIG. 4 sets forth two tables showing weight values stored in array 103 and data from multiplication mode data reads according to another embodiment of memory 101 in performing the operations of prior art multiplier 201. Table 401 shows 4 rows and 7 columns of data stored in array 103. In the embodiment of FIG. 4, the same values of A0-3 are stored in 4 rows (rows 0-3), each at different column positions. During each of the 4 multiplication mode data reads, a different row is read. For example, for cycle 1, row 0 is read, for cycle 2, row 1 is read, for cycle 3, row 2 is read, and for cycle 4, row 3 is read. B0 is multiplied by the values of A0-3 in row 0 in cycle 1, B1 is multiplied by the values of A0-3 in row 1 in cycle 2, B2 is multiplied by the values of A0-3 in row 2 in cycle 3, and B3 is multiplied by values A0-3 in row 3 in cycle 4. In the embodiment of FIG. 4, those memory cells of rows 0-3 and columns 0-6 that do not have a value of A0-3 stored therein are set to 0.

Table 403 shows the four outputs of each read of the four cycles and the signals of each column with respect to the signals of prior art multiplier 201 of FIG. 2. Because the values A0-3 occupy different column positions in each of rows 0-3, the outputs of each of the reads are provided by different columns. For example, for cycle 1, A0-3 are located in columns 3-6 of row 0. Accordingly, the outputs of read cycle 1 (X2-1, X1-1, X0-1, P0) are provided by sense amplifiers coupled to columns 3-6. For cycle 2, values A0-3 are located in columns 2-5 of row 1. Accordingly, the output (Y3-1, Y2-1. Y1-1, Y0-1) of read cycle 1 is provided by sense amplifiers coupled to columns 2-5.

As shown by table 403, the output of each successive read appears at the outputs of the sense amplifiers shifted to the left by one position. Accordingly, an adder block (e.g. block 601 of FIG. 6) does not need a shift to generate the resultant product. Instead, a 7-bit adder with carry out could be used to generate the resultant 8-bit product.

Figure 6:
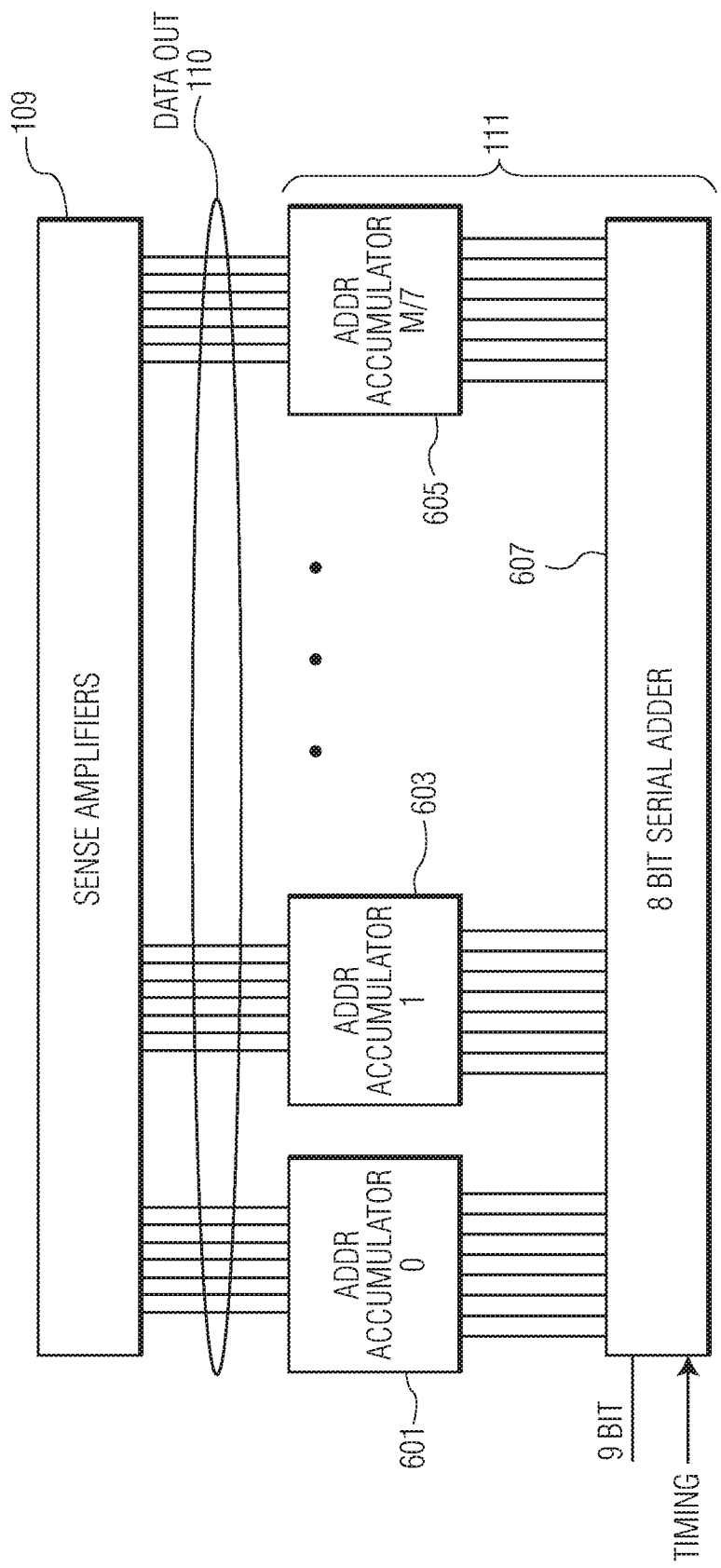
FIG. 6 is a block diagram of accumulation circuitry according to another embodiment of the present invention.

FIG. 6 is a block diagram of accumulation circuitry 111 for the embodiment of FIG. 4. Each adder block 601, 603, and 605 includes 7 inputs coupled to 7 sense amplifiers (e.g. one block would be coupled to the sense amplifiers coupled to columns 0-6). Each block would include a 7-bit adder with an 8-bit output (with one output for a carry out). The 8-bit outputs are provided to an 8-bit serial adder that can add any of the outputs of the adder blocks.

The embodiment of FIG. 4/FIG. 6 has the advantage of having simpler adder blocks (601) that don't require a shifter as opposed to the embodiment of FIG. 3/FIG. 5. However, the embodiment of FIG. 3/FIG. 5 utilizes ⅐th of the memory space of memory array 103 for storing a weight value.

Figure 7:
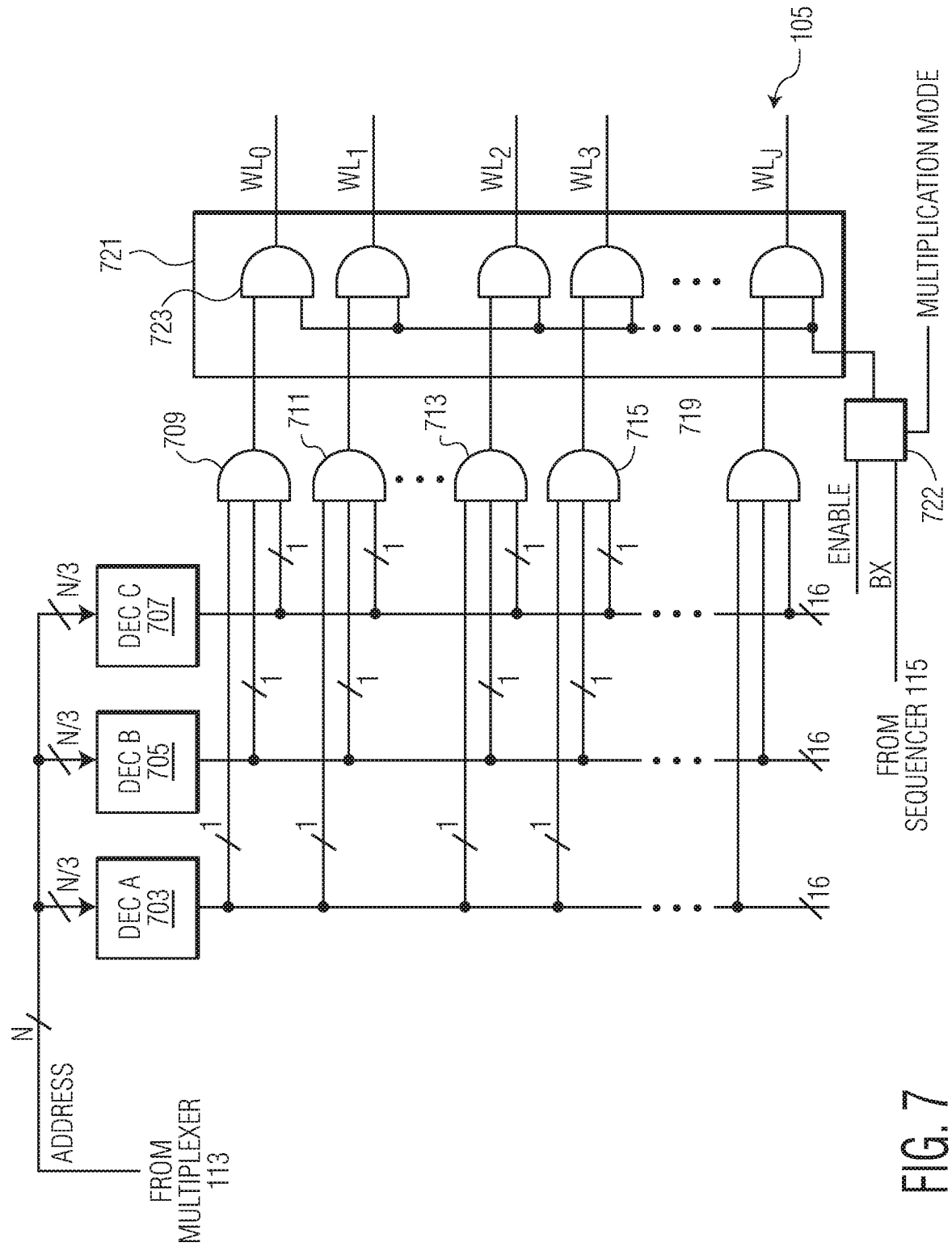
FIG. 7 is a circuit diagram of a row decoder according to one embodiment of the present invention.

FIG. 7 is a block diagram of row decoder 105 according to one embodiment of the present invention. Row decoder 105 includes three decoder blocks 703, 705, and 707. Each decoder block receives a portion of a read address from multiplexer 113 and provides a set of decoded lines (e.g. 16 lines). Decoder 105 includes 3-input AND gates (709, 711, 713, 715, and 719) where each gate includes an input coupled to a decoded line from each of the three decoder blocks 703, 705, and 707. The outputs of each 3-input AND gate indicate whether a word line should be asserted. Decoders blocks 703, 705, and 707 are configured such that the output of only one 3-input AND gate is asserted in response to each received address from multiplexer 113. Each output of the 3-input AND gates are provided to a word line driver (723) of word line driver set 721. Each word line driver includes an enable input coupled to multiplexer 722. A word line driver asserts its word line ($WL_{0-J}$) when both the 3-input AND gate coupled to its input and the output of multiplexer 722 are asserted.

Multiplexer 722 is used to selectively assert a word line based upon a value of an operand bit (BX) in a multiplication mode data read. Controller 125 of FIG. 1 asserts signal MULTIPLICATION MODE to place decoder 105 in a multiplication mode. In a multiplication mode, if BX is a 1, the word line drivers of set 721 are enabled where the word line associated with the received address will be asserted. However, if BX is 0, then none of the word lines will be asserted and the sense amplifiers will read all zeros during the read.

In other embodiments, a row decoder may be configured in other ways to implement a multiplication mode data read. For example, each of the 3-input AND gates (e.g. 709) may include a fourth input that receives the MULTIPLICATION MODE signal.

Although FIGS. 3 and 4 described the multiplication of 4×4 bit values, memory 101 may perform the multiplication of input data and/or weights of other bit sizes in other embodiments. For example, the number of bits of either the input data or weights may be of one or greater (e.g. 1 bit, 2 bits, 8 bits, 16, bits, 24 bits, 32 bits, 64 bits etc.).

The multiplication mode of memory 101 may be used to implement neural nets where the input data can be multiplied by weight values to derive nodes of a neural net. For example, in a motorized vehicle, each of the analog inputs may provide data from a sensor that senses external conditions where the external conditions are then multiplied by the weights and added to generate the next layer of nodes of the neural net. In some embodiments, the digital input data may represent the node values from a previous layer. The multiplication mode reads may be used to apply weights to those values to generate the next layer of nodes.

In some embodiments, controller 125 is able to write data to memory array 103. In some embodiments, controller 125 writes the data from accumulation circuitry 111 to memory array 103 where it can be read by a system processor (not shown). In some embodiments, controller 125 can operate independently to process input data from a system processor or analog inputs. In some embodiments, controller 125 can process input data when a system processor is in a low power mode. In some embodiments, an activation function (such as hyperbolic tangent, tan h) is applied to the output of accumulation circuitry 111 in order to produce a node value for the subsequent layer of a neural net. The activation function can be applied by controller 125, dedicated hardware or another processor.

Providing a memory where a data read can be used to multiply stored data by a 1-bit operand may in some embodiments, reduce the amount of time needed to perform a multiplication operation. For example, if such an operation were performed by a processor, then the data would first be read from memory, and then the mathematical operation would be performed. However, with embodiments shown, multiplication operations and data read operations are can be performed simultaneously, thereby reducing the number of clock cycles to perform the multi-bit multiplication operation.

In addition, because the weight values being multiplied are stored in the memory array and not downloaded and stored in registers where they are accessed, the time and energy consumed for the memory access and store operations can be avoided. Another advantage is that weight value coherency issues can be greatly reduced. Because the weight values are accessed directly from the memory, a multiplication operation will always be performed utilizing the latest values for the weights.

In embodiments where the memory array includes NVM cells, weight values do not have to be reloaded into array 103 during power up operations.

In some embodiments, memory 101 can also be used to store and read data by normal mode data reads initiated by a system processor. In some embodiments, bit cells of a row can be read in a multiplication mode, rewritten with new data, and then read in a normal operational mode (or read in normal mode without being rewritten). This provides a system with flexibility in allowing for a memory array to be used for other processes. Also, by providing a memory that is accessible by a system processor, weight values can be updated or modified including during operation.

Furthermore, providing accumulation circuitry coupled to the outputs of the sense amplifiers to perform addition of the multiplied products from the data reads allows for the addition of the products during the data read. Accordingly, a sum of products can be generated in the amount of time needed to perform multiplication mode reads of the 1 by N multiplied data.

In one embodiment, a memory includes a memory array including a plurality of bitcells in which each bitcell is coupled to a corresponding word line of a plurality of word lines. The memory include sense amplifiers for reading data stored in the plurality of bitcells of the memory array. The memory includes a row decoder coupled to the memory array and configured to receive an access address which corresponds to a selected word line of the plurality of word lines and configured to receive a bit value of an M-bit operand, wherein bitcells of the memory array associated with the selected word line are configured to store an N-bit weight value in which M can be any integer greater than zero and N can be any integer greater than one. The row decoder is configured to, for a read operation in a multiplication mode at the selected word line, selectively activate the selected word line based on the bit value of the operand, wherein in response to the read operation, the sense amplifiers sense bit lines coupled to bitcells of the selected word line of the memory array to obtain multiplication data.

In another embodiment, a memory includes a memory array including a plurality of bitcells in which each bitcell is coupled to a corresponding word line of a plurality of word lines and implements binary storage. The memory includes a row decoder coupled to the memory array and configured to receive an access address which corresponds to a selected word line of the memory array. In a non-multiplication mode, the row decoder is configured to activate the selected word line to perform a read from the memory array at the selected word line. In a multiplication mode where bitcells of the plurality of bitcells associated with the selected word line are configured to store an N-bit weight value. The row decoder is configured to selectively activate the selected word line based on a bit value of an M-bit operand in which M can be any integer greater than zero and N can be any integer greater than one for a read operation of the bitcells associated with the selected word line.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A memory comprising:
   a memory array including a plurality of bitcells in which each bitcell is coupled to a corresponding word line of a plurality of word lines;
   sense amplifiers for reading data stored in the plurality of bitcells of the memory array;
   a row decoder coupled to the memory array and configured to receive an access address which corresponds to a selected word line of the plurality of word lines and configured to receive a bit value of an M-bit operand, wherein bitcells of the memory array associated with the selected word line are configured to store an N-bit weight value in which M can be any integer greater than zero and N can be any integer greater than one, wherein the row decoder is configured to, for a read operation in a multiplication mode at the selected word line, selectively activate the selected word line based on the bit value of the operand, wherein in response to the read operation, the sense amplifiers sense bit lines coupled to bitcells of the selected word line of the memory array to obtain multiplication data.

2. The memory of claim 1, wherein when the bit value of the operand has a first logic state, the selected word line is activated for the read operation, and when the bit value of the operand has a second logic state, different from the first logic state, the read operation in the multiplication mode is performed without activating the selected word line.

3. The memory of claim 2, wherein when the bit value of the operand has the first logic state, the multiplication data is equivalent to the N-bit weight value, and when the bit value of the operand has a second logic state, the multiplication data is zero.

4. The memory of claim 1, further comprising:
   a controller;
   accumulation circuitry coupled to the controller and the sense amplifiers, wherein the controller is configured to:
      direct a first read operation in the multiplication mode of the bitcells associated with the selected word line for a first read cycle using a first bit value of the operand to selectively activate the selected word line for the first read operation and latch the multiplication data from the sense amplifiers in the accumulation circuitry; and direct subsequent read operations in the multiplication mode of the bitcells associated with the selected word line for each of (M−1) subsequent read cycles using a different bit value of the operand to selectively activate the selected word line for each subsequent read operation, in which at each of the subsequent read operations, the accumulation circuitry performs a shift and accumulate of corresponding multiplication data from the sense amplifiers, wherein after the first and subsequent read operations, the accumulation circuitry is configured to provide a corresponding multiplication result of the M-bit operand multiplied by the N-bit weight value.

5. The memory of claim 4, wherein for each of the first read operation and subsequent read operations, the read operation is performed regardless of whether the selected word line is activated or not.

6. The memory of claim 4, wherein the accumulation circuitry receives multiplication data from N sense amplifier outputs corresponding to N bit lines of the memory array.

7. The memory of claim 1, further comprising:
a controller;
accumulation circuitry coupled to the controller and the sense amplifiers, wherein the controller is configured to:
direct a first read operation in the multiplication mode of the bitcells associated with the selected word line for a first read cycle using a first bit value of the operand to selectively activate the selected word line for the first read operation and latch the multiplication data from the sense amplifiers in the accumulation circuitry; and
direct subsequent read operations in the multiplication mode of the bitcells associated with subsequent selected word lines for each of (M−1) subsequent read cycles, wherein the rows of bitcells coupled to the subsequent selected word lines of the memory array are configured to store the N-bit weight value at different bit positions of the array, and wherein the row decoder is configured to use a different bit value of the operand to selectively activate a subsequent selected word line for each subsequent read operation, in which at each of the subsequent read operations, the accumulation circuitry accumulates corresponding multiplication data from the sense amplifiers,
wherein after the first and subsequent read operations, the accumulation circuitry is configured to provide a corresponding multiply result of the M-bit operand multiplied by the N-bit weight value.

8. The memory of claim 7, wherein for each of the first read operation and subsequent read operations, the read operation is performed regardless of whether the selected word line is activated or not.

9. The memory of claim 1, wherein activation of the selected word line is dependent upon a single bit of the operand in a multiplication mode.

10. The memory of claim 1, wherein the row decoder is configured to, when not operating in the multiplication mode, receive a second access address which corresponds to a second selected word line of the memory array and, for any read operation of bitcells associated with the second selected word line, activate the second selected word line.

11. The memory of claim 10, wherein the selected word line and the second selected word line are a same word line.

12. A memory comprising:
a memory array including a plurality of bitcells in which each bitcell is coupled to a corresponding word line of a plurality of word lines and implements binary storage;
a row decoder coupled to the memory array and configured to receive an access address which corresponds to a selected word line of the memory array, wherein:
in a non-multiplication mode, the row decoder is configured to activate the selected word line to perform a read from the memory array at the selected word line, and
in a multiplication mode where bitcells of the plurality of bitcells associated with the selected word line are configured to store an N-bit weight value, the row decoder is configured to selectively activate the selected word line based on a bit value of an M-bit operand in which M can be any integer greater than zero and N can be any integer greater than one for a read operation of the bitcells associated with the selected word line.

13. The memory of claim 12, further comprising:
sense amplifiers for reading data stored in bitcells of the memory array;
a controller;
accumulation circuitry coupled to data outputs of the sense amplifiers, wherein the controller is configured to, in a multiplication mode:
direct a first read operation of the bitcells associated with the selected word line for a first read cycle using a first bit value of the operand to selectively activate the selected word line for the first read operation and latch a read output from the sense amplifiers in the accumulation circuitry; and
direct subsequent read operations of the bitcells associated with the selected word line for each of (M−1) subsequent read cycles using a different bit value of the operand to selectively activate the selected word line for each subsequent read operation, in which at each of the subsequent read cycles, the accumulation circuitry performs a shift and accumulate of a corresponding read output from the sense amplifiers,
wherein after the first and subsequent read operations, the accumulation circuitry is configured to provide a corresponding multiply result corresponding to the M-bit operand multiplied by the N-bit weight value.

14. The memory of claim 13 wherein the accumulation circuitry, further comprising:
an adder configured to provide a summation of a plurality of multiply results corresponding to M-bit operands multiplied by N-bit weight values stored in the memory array as generated by the accumulation circuitry during read operations in the multiplication mode.

15. The memory of claim 13, wherein, during the non-multiplication mode, in response to read operations, read data is provided from the sense amplifiers as output data from the memory array.

16. The memory of claim 13, further comprising:
a controller coupled to the memory array configured to allow read access to a first section of the memory array in the multiplication mode and allow read access to a second section of the memory array in the non-multiplication mode.

17. The memory of claim 12, further comprising:
sense amplifiers for reading data stored in bitcells of the memory array;
a controller;
an accumulation circuitry coupled to data outputs of the sense amplifiers, wherein the controller is configured to, in a multiplication mode:
  direct a first read operation of the selected word line for a first read cycle using a first bit value of the operand to selectively activate the selected word line for the first read operation and latch a read output from the sense amplifiers in the accumulation circuitry; and
  direct subsequent read operations of subsequent selected word lines for each of (M−1) subsequent read cycles, wherein rows of bitcells of the memory array coupled to each of the subsequent selected word lines are configured to store the M-bit weight value at different bit positions in the array, and wherein the row decoder is configured to use a different bit value of the operand to selectively activate the subsequent selected word line for each subsequent read operation, in which at each of the subsequent read cycles, the accumulation circuitry accumulates a corresponding read output from the sense amplifiers, wherein after the first and subsequent read operations, the accumulator circuitry is configured to provide a corresponding multiply result corresponding to the M-bit operand multiplied by the N-bit weight value.

18. The memory of claim 17, wherein the accumulation circuitry further comprises:
  an adder configured to provide a summation of a plurality of multiply results corresponding to M-bit operands multiplied by N-bit weight value stored in the memory array as generated by the accumulation circuitry during read operations in the multiplication mode.

19. The memory of claim 17, wherein, in the multiplication mode, the selected word line and the subsequent selected word lines are all different word lines, wherein the corresponding multiply result corresponding to the M-bit operand multiplied by the N-bit weight value is generated from data from (N*2)−1 of the sense amplifiers.

20. The memory of claim 12, further comprising:
  a controller configured to provide a multiplication mode indicator to the row decoder which indicates whether a read operation is to be performed in the multiplication mode or in the non-multiplication mode, and a weight address, wherein in the multiplication mode, the selected address is the weight address provided by the controller.

* * * * *